United States Patent [19]

Brown et al.

[11] Patent Number: 4,945,399
[45] Date of Patent: Jul. 31, 1990

[54] ELECTRONIC PACKAGE WITH INTEGRATED DISTRIBUTED DECOUPLING CAPACITORS

[75] Inventors: Michael B. Brown, Binghamton; William S. Ebert, Endicott; Leonard T. Olson, Endwell; Richard R. Sloma, Endicott, all of N.Y.

[73] Assignee: International Business Machines Corporation, Armonk, N.Y.

[21] Appl. No.: 300,681

[22] Filed: Jan. 19, 1989

Related U.S. Application Data

[63] Continuation of Ser. No. 913,435, Sep. 30, 1986, abandoned.

[51] Int. Cl.$^5$ .............................................. H01L 23/02
[52] U.S. Cl. ........................................ 357/74; 357/71; 357/40; 357/51; 357/55; 357/80; 357/81
[58] Field of Search ..................... 357/51, 55, 40, 71, 357/80, 74, 81

[56] References Cited

U.S. PATENT DOCUMENTS

| | | | |
|---|---|---|---|
| 3,049,647 | 8/1962 | Lincoln | 317/101 |
| 3,191,098 | 6/1965 | Fuller | 317/101 |
| 3,290,756 | 12/1966 | Dreyer | 29/155.5 |
| 3,356,786 | 12/1967 | Helms | 174/68.5 |
| 3,530,411 | 9/1970 | Sear | 333/96 |
| 3,614,832 | 10/1971 | Chance et al. | 29/626 |
| 3,983,458 | 9/1976 | Jordan et al. | 317/101 |
| 4,153,988 | 5/1979 | Doo | 29/626 |
| 4,210,950 | 7/1980 | Fraser, Jr. et al. | 361/329 |
| 4,222,090 | 9/1980 | Jaffe | 361/389 |
| 4,225,900 | 9/1980 | Ciccio et al. | 361/365 |
| 4,231,154 | 11/1980 | Gazoik et al. | 29/840 |
| 4,237,522 | 12/1980 | Thompson | 361/393 |
| 4,249,196 | 2/1981 | Durney et al. | 357/74 |
| 4,251,852 | 2/1981 | Ecker et al. | 361/386 |
| 4,274,124 | 6/1981 | Feinberg et al. | 361/275 |
| 4,328,530 | 5/1982 | Bajorek et al. | 361/308 |
| 4,328,531 | 5/1982 | Nagashima et al. | 361/401 |
| 4,349,862 | 9/1982 | Bajorek et al. | 361/401 |
| 4,377,316 | 3/1983 | Ecker et al. | 339/17 |
| 4,378,537 | 3/1983 | Scandurra | 333/100 |
| 4,420,652 | 12/1983 | Ikeno | 174/52 |
| 4,430,690 | 2/1984 | Chance et al. | 361/321 |
| 4,453,176 | 6/1984 | Chance et al. | 357/51 |
| 4,480,288 | 10/1984 | Gazdik et al. | 361/398 |
| 4,494,172 | 1/1985 | Leary et al. | 361/400 |
| 4,549,200 | 10/1985 | Ecker et al. | 357/80 |
| 4,827,327 | 5/1989 | Miyauchi et al. | 357/71 |

FOREIGN PATENT DOCUMENTS

| | | | |
|---|---|---|---|
| 0083020 | 7/1983 | European Pat. Off. | |
| 0083405 | 7/1983 | European Pat. Off. | |
| 56-08854 | 1/1981 | Japan | 357/51 |
| 0568854 | 1/1981 | Japan | |
| 59-5654 | 6/1982 | Japan | 352/51 |
| 0595654 | 1/1984 | Japan | |
| 59-54254 | 3/1984 | Japan | 357/51 |

OTHER PUBLICATIONS

McIntosh et al., "Packaging of Intergrated Circuit," *IBM Technical Disclosure Bulletin*, vol. 15, No. 6, Nov. 72, 1977-1980.

(List continued on next page.)

*Primary Examiner*—William Mintel
*Attorney, Agent, or Firm*—John D. Crane; M. H. Klitzman

[57] ABSTRACT

A semiconductor chip carrier includes a plurality of distributed high frequency decoupling capacitors as an integral part of the carrier. The distributed capacitors are formed as a part of the first and second layers of metallurgy and separated by a layer of thin film dielectric material built up on a substrate. The distributed capacitors are positioned to extend from a ground pin of one of the layers of metallurgy to a plurality of mounting pads which are intergral parts of the other of the layers of metallurgy. A semiconductor chip is mounted to the mounting pads and receives electrical power and signals therethrough. The distributed capacitors decrease electrical noise associated with simultaneous switching of relatively large numbers of off-chip drivers which are electrically connected to the semiconductor chip.

3 Claims, 2 Drawing Sheets

OTHER PUBLICATIONS

Watari et al., "Packaging Technology for the NEC SX Supercomputer," 35th ECCP, IEEE, May 20, 22, 1985, Washington, DC, pp. 192–198.

*IBM Technical Disclosure Bulletin,* vol. 15, No. 6, Nov. 1972, "Packaging of Integrated Circuits", by C. M. McIntosh et al., pp. 1977–1980.

*IBM Technical Disclosure Bulletin,* vol. 20, No. 9, Feb. 1978, "Internal Capacitors and Resistors for Multilayer Ceramic Modules", R. O. Lussow, pp. 3436.

*IBM Technical Disclosure Bulletin,* vol. 22, No. 12, May 1980, "Low Capacitive via Path Through High Dielectric Constant Material", B. Narken et al., pp. 5330–5331.

L. T. Olson et al., "Chip Carrier Enhancements for Improving Electrical Performance" 35th Electronic Components Conference Proceedings, May 20, 22, 1985, pp. 372–378.

L. T. Olson et al., "Three Dimensional Modeling for Complex Integrated Circuit Packages", 36th ECCP, May 5–7, 1986, Seattle, WA, pp. 187–202.

T. R. Homa, "Reliability of Metallized Ceramic/Polyimide Substrates", 36th ECCP, May 5–7, 1986, Seattle, WA, pp. 609–615.

C. M. Val et al., "A Breakthrough in Advanced Very High-Speed Integrated Circuit (VHSIC) Packaging-Advantages of the Leadless Chip Carrier Over Pin Grid Arrays (PGA)", 1985 ISHM Proceedings, Nov. 11–14, 1985, Anaheim, CA, pp. 334–342.

Patent Abstracts of Japan, vol. 10, No. 293, (E–433) [2349], Oct 4, 1986; & JP-A-61 112369 (Hitachi Ltd) May 30, 1986.

Patent Abstracts of Japan, vol. 10, No. 145 (E–407) [2202], May 28, 1986; & JP-A-61 6846 (Nippon Denki K.K.) Jan 13, 1986.

Patent Abstracts of Japan, vol. 8, No. 194 (E–264) [1631], Sept. 6, 1984; & JP-A-59-82753 (Matsushita Denshi Kogyo K.K.) May 12, 1984.

ELECTRONIC PACKAGE WITH INTEGRATED DISTRIBUTED DECOUPLING CAPACITORS

This application is a continuation of application Ser. No. 06/913,435 filed Sept. 30, 1986, now abandoned

BACKGROUND OF THE INVENTION

1. Field of the Invention

This invention relates to integrated circuit semiconductor chip packages and more particularly to semiconductor chip carriers, first level electronic packages having integrated distributed high frequency decoupling capacitors as part of the package.

2. Background Information

As very large scale integrated (LSI) circuits tend to get more complex, there is a need to switch more output driver circuits simultaneously at a faster rate in order to increase the performance thereof. This increase in the switching rate results in an increase in the amount of electrical noise which is associated therewith. Various techniques have been utilized in the art to minimize the level of noise associated with the increase in the magnitude of the switching rate. One known technique for reducing the level of noise is to incorporate discrete capacitors as a decoupling capacitor between associated voltage pins. Generally, the discrete capacitor, which is mounted a distance away from the semiconductor chip, is electrically coupled thereto by a plurality of power wiring lines or large power buses. These power wiring lines typically represent high inductance paths. Moreover, as the amount of current flowing in the plurality of wiring lines increases, a voltage drop develops thereacross. The voltage drop is viewed as unwanted power distribution noise. One technique of minimizing the effective inductance of the power paths is to move the discrete capacitor as close to the semiconductor chip as possible. However, in view of either the layout of the wiring lines associated with the semiconductor chip or the physical dimensions of the discrete capacitor, the discrete capacitor cannot be positioned such that there is no voltage drop or noise. Additionally, the discrete capacitors used for this purpose are usually high frequency, low inductance capacitors which increase the cost associated with the use of this technique. The level of noise created by the increase in the rate which the current switches will limit the performance and the number if LSI circuits which can be switched simultaneously.

Consequently, there is a need for a technique for reducing the noise associated with the increase in the rate which the current switches while minimizing the inductance paths and the cost associated therewith.

OBJECTS OF THE INVENTION

Therefore it is an object of the invention to provide an improved electronic package for semiconductor chips.

It is another object of the invention to provide decoupling capacitors which are an integral part of a power distribution system.

It is a further object of the invention to provide a technique for forming a plurality of decoupling capacitors simultaneously with the formation of the power distribution system.

It is still another object of the invention to provide a technique of increasing the capacitance of a decoupling capacitor by using a plurality of interleaved layers of metal and dielectric material.

SUMMARY OF THE INVENTION

In accordance with these objects, features and advantages of the invention are accomplished by an electronic package disclosed herein. This invention contemplates an electronic package which includes a plurality of integrated, distributed decoupling capacitors. A bottom layer of metal, formed on a substrate includes at least one portion which forms a first plate of a decoupling capacitor and includes at least one electronic connection for attachment of a semiconductor chip. A thin layer of dielectric material is positioned on and covers the bottom layer of metal. A top layer of metallurgy which includes the second plate of the capacitor is formed on the layer of dielectric material and includes at least one connection to a contact of the semiconductor chip. The second plate is positioned relative to the first plate to form the decoupling capacitor having the thin layer of dielectric materials therebetween.

BRIEF DESCRIPTION OF THE DRAWINGS

This invention will be described in greater detail by referring to the accompanying drawings and the description of the best mode that follows.

DESCRIPTION OF THE BEST MODE FOR CARRYING OUT THE INVENTION

Figure 1:
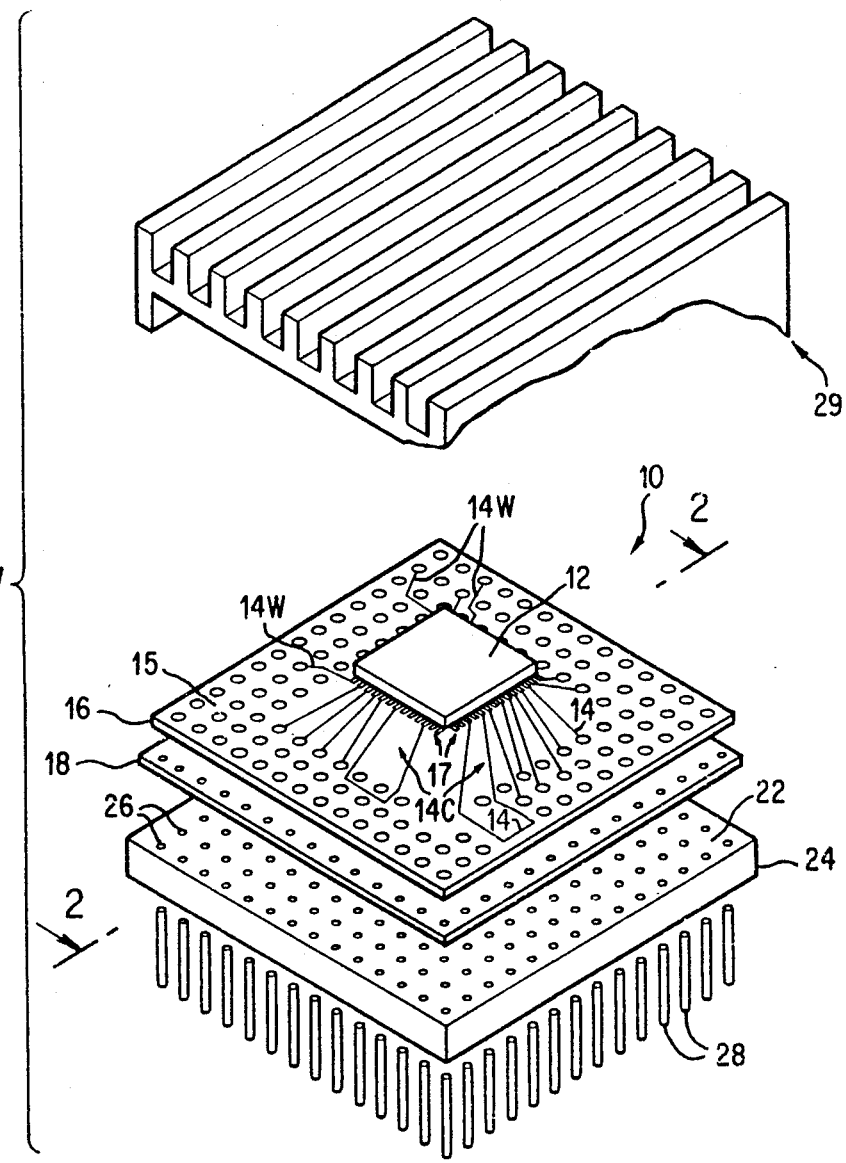
FIG. 1 is an exploded isometric view of an electronic package in accordance with the principles of this invention.

FIG. 1 illustrates an isometric view of an electronic package or a carrier 10 for large scale integrated (LSI) electronic circuit chips such as a chip 12. The chip 12 is electrically coupled to a top layer of metal 14 formed on an upper surface 15 of a dielectric layer 16. The dielectric layer 16 consists of a thin film dielectric material such as polyimide. Any material having suitable insulating properties can be used in place of the polyimide. The top layer of metal 14 includes wiring lines 14a which provide electrical connections for both signals and power for the chip 12 and a portion thereof, identified by reference numeral 14, also serves as a plate of a decoupling capacitor 14C. The plate of the capacitor 14C includes at least one connection 17 to which the chips 12 may be attached. A bottom layer of metal 18 is formed on an upper surface 22 of a substrate 24 and is positioned adjacent to a lower surface of the dielectric layer 16 which electrically isolates the bottom layer of metal 18 from the top layer of metal 14. The bottom layer of metal 18 is coupled to a first potential, such as a ground potential, and serves as a ground plane for the carrier 10. The bottom layer of metal 18 extends beneath the aforementioned capacitor plate 14C including the connection 17 of the top layer of metal 14 and serves as another plate of the capacitor. A plurality of holes 26 is formed in the substrate 24 for receiving a plurality of pins 28 therein. Such pins 28 can either be brazed to electrically conductive vias or can be inserted through the holes as is well known in the art.

Figure 2:
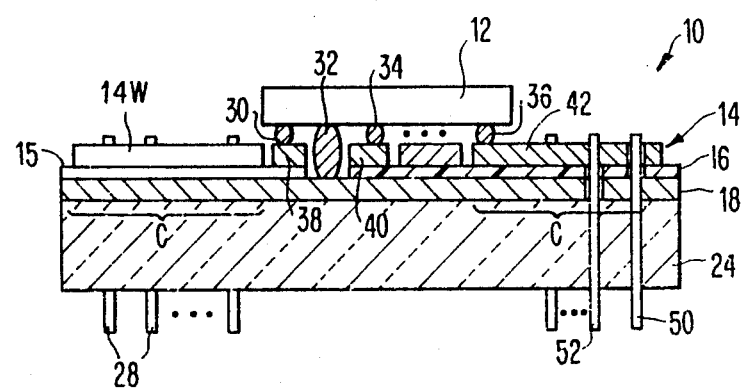
FIG. 2 is a cross-sectional view of the electronic package taken along line 2—2 in FIG. 1.

Referring to FIG. 2, there is shown a cross-sectional view of the carrier 10 in its assembled form. As noted above, the chip 12 is connected to the top layer of metal 14 and the bottom layer of metal 18. A plurality of solder bonds 30, 32, 34 and 36, which are representative of numerous solder bonds, provides support for and electrical connections for both signals and power to the chip 12. Solder bonds 30, 32, 34 and 36 facilitate the electrical connections between the chip 12 and connection pads 38, 40 and 42 of the top layer of metal 14 and ground plane of the bottom layer of metal 18. The connecting pads 38, 40 and 42 are an integral part of the top layer of metal 14 and are formed simultaneously therewith. The top layer of metal 14 includes a plurality of wiring lines 14W, which facilitate the interconnection of selected ones of the pins 28 to selected ones of the solder bonds.

The pins 28, which extend through the substrate 24, the bottom layer of metal 18, the dielectric layer 16 and the top layer of metal 14 facilitate connecting signals and power to the chip 12. Additionally, selected ones of the pins 28 connect the first potential to the bottom layer of metal 18 and others connect the top layer of metal 14 to a second potential (a voltage level other than ground). A cap 29 is positioned over and encloses a portion of the carrier 10. The bottom layer of metal 18 is coupled to the first potential and serves as one plate of the capacitor C. As one of the plates of the capacitor, the bottom layer of metal 18 extends from the solder bond 32 out to a module ground pin such as pin 50. In a similar manner, the top level of metal 14, as the other plate of the capacitor C, extends from a power solder joint, such as solder joint 36, and out to a module voltage pin 52 connected to a second potential. It should be noted that the size of the first and the second plates is limited only by the space available to form the plates. Thus, the first and the second plates may start underneath chip 12 and extend beyond the module ground pin 50 and the module voltage pin 52, respectively. In this manner, a decoupling parallel-plate capacitor C is formed having the dielectric layer 16 positioned between the top layer of metal 14 and the bottom layer of metal 18. Moreover, the capacitor C is formed at the connecting pad 42 of the chip 12 and is distributed to and beyond the module voltage pin 52.

The capacitance of the decoupling parallel-plate capacitor C may be increased by substituting a dielectric material having a higher dielectric constant than that of the polyimide material. Another technique for increasing the capacitance of the decoupling capacitor C is to increase the size of the plates thereof. Moreover, the capacitance of the capacitor C may be increased by adding additional alternating layers of metal and dielectric material using techniques which are well known in the art. Alternately, if space on the substrate is limited, the capacitance of the capacitor C may be increased by coupling a discrete capacitor, as is well known in the art, to the parallel-plate capacitor as hereinbelow further described.

Figure 3:
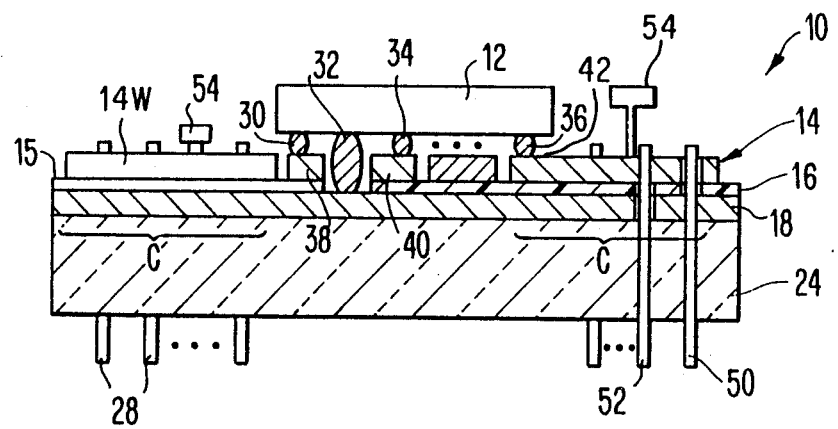
FIG. 3 is a cross-sectional view of the electronic package of FIG. 1 illustrating the use of discrete capacitors in accordance with the principles of this invention.

Referring to FIG. 3, the parallel-plate capacitor C is formed in the manner as set forth above. The discrete capacitor 54 is then mounted, forming an electrical connection to the top layer of metal 14 and the bottom layer of metal 18 using techniques which are well known in the art.

In summary, the capacitor C is formed simultaneously with application of the bottom layer of metal 18 to the substrate 24, the dielectric layer 16 and the top layer of metal 14. The ground plane or the bottom layer of metal 18 which includes a first layer of chrome, a middle layer of copper and a second layer of chrome, is formed on the substrate 24. The substrate 24 can be a ceramic substrate or any thin film structure such as that used in tape automated bonding. Alternately, the substrate 24 can be a structure such as a circuit board having an epoxy base. Thereafter, metal is etched away to form the personality of the substrate 24, which includes at least one connection pad to a plate of the decoupling capacitor C. The thin film dielectric layer 16 is then applied to the bottom layer of metal 18 using techniques such as spraying which are well known in the art. Openings are formed in the dielectric layer 16 to facilitate connections between the solder bond 32 and the bottom layer of metal 18. The top layer of metal 14, which is formed on the upper surface 15 of the dielectric layer 16, includes a first layer of chrome, a middle layer of copper and a second layer of chrome. The top layer of metal 14 further includes portions, such as connection pads 38, 40 and 42, positioned relative to the bottom layer of metal 18 to form the capacitor C therebetween. The capacitor C, in the form of a parallel-plate decoupling capacitor, extends from the selected one of the pads 38, 40 and 42, which are part of the other plate of the capacitor, out and beyond a selected one of the voltage pins, such as pin 52. When power voltage transients occur due to current flow, they are decoupled by capacitor C. Depending on the location of pads 38, 40 and 42, some or all of capacitor C may be disposed beneath the chip 12. Moreover, the shape of the plates of the capacitor C is not important. The capacitor C can be formed on any available space as long as the top layer of metal 14 (one plate) is positioned relative to the bottom layer of metal 18 (another plate) having the dielectric layer 16 positioned therebetween and the total area of the plates is such as to increase the capacitance of the capacitor C to the desired level. Thus, the capacitor C may be formed on the space beneath the chip 12.

Figure 4:
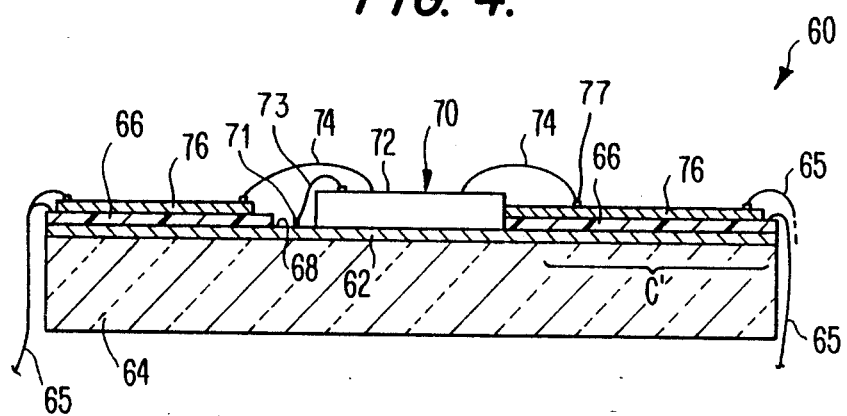
FIG. 4 is a cross-sectional view of an alternate embodiment of the electrical package in accordance with the principles of this invention.

Referring to FIG. 4, there is shown a cross-sectional view of an alternate embodiment of the invention utilizing a flip-chip carrier 60. A bottom layer of metal 62 is formed on a substrate 64. Portions of the bottom layer of metal 62 are etched away to form the personality of the substrate 64 which includes at least one pad 71 to serve as a connection to a plate of a decoupling capacitor C'. The plate is connected to a first potential through one or more of a plurality of pins 65. A layer of dielectric material 66 is applied to an upper surface 68 of the bottom layer of metal 62. The semiconductor chip 70 is attached to the top layer of metal 62 so that a plurality of mounting pads (not shown) located on chip surface 72 are exposed to facilitate the attachment of a plurality of signal connectors 74 and power connectors 73, 75. In alternate embodiments the chip 70 can be attached to a layer other than the first layer of metal 62. Moreover, the capacitor C' in a multi-layer package could extend beneath the chip, in which case the corresponding portions of some or all layers thereunder are removed. The bottom layer of metal 62 is electrically connected to one or more of the mounting located on chip surface pads 72 by power connectors 73. A second layer of metal 76 is on a surface of the layer of dielectric material 66. Portions of the top layer of metal 76 are etched away to form at least one pad 77 which serves as a connection to the other plate of the decoupling capacitor C'. The chip 70 is connected to the pad 77 by means of a power connector 75. The other plate is connected to a second potential through one or more of the pins 65. The other plate is also connected to the semiconductor chip 70 by one or more of the connectors 75. Moreover, one plate is positioned relative to the other plate having the layer of dielectric material 66 positioned therebetween to form the decoupling capacitor C'. The lengths of the connectors 73, 74, 75 are kept to a minimum in order to minimize any inductance created thereby and to bring the decoupling capacitor C' as close to the mounting pads 71, 77 as possible.

While the invention has been particularly shown and described with reference to a preferred embodiment thereof, it will be understood by those skilled in the art that various changes in detail may be made therein without departing from the spirit, scope and teaching of the invention. For example, although the preferred embodiment hereinabove described represents a first potential being ground and a second potential being a voltage other than ground, any two disparate potentials could be used. Accordingly, the electronic package herein disclosed is to be considered merely as illustrative, and the invention is to be limited only as specified in the claims.

What is claimed is:

1. An electronic packaging structure comprising:
   (a) a substrate;
   (b) a layer of metallurgy on the substrate, said layer of metallurgy having a pad for unitary intermetallic electrical connections and including at least one portion forming a first plate of a capacitor;
   (c) a dielectric layer covering the layer of metallurgy;
   (d) a layer of metallurgy deposed on the dielectric layer, forming a second plate of said capacitor and having at least one pad for unitary intermetallic electrical attachment thereto, said second plate positioned relative to the first plate of the capacitor and separated therefrom by a portion of the dielectric layer;
   (e) said electronic packaging structure having a plurality of apertures extending from the bottom of said substrate to the top of said second plate of said capacitor, said apertures extending through the plates of said capacitor;
   (f) a semiconductor chip mounted on the layer of metallurgy disposed on the dielectric layer, the semiconductor chip being electrically connected to both of said layers of metallurgy by a plurality of unitary intermetallic electrical connections; and
   (g) a plurality of pins extending entirely through said apertures, thereby providing electrical connections between said semiconductor chip and the bottom of said substrate.

2. The packaging structure as recited in claim 1 wherein the layer of metallurgy on the substrate includes:
   (a) a first layer of chrome formed on the substrate;
   (b) a layer of copper formed over and covering the first layer of chrome; and
   (c) a second layer of chrome formed over and covering the layer of copper.

3. The packaging structure as recited in claim 2 wherein the layer of metallurgy disposed on the dielectric layer includes:
   (a) a first layer of chrome formed on the dielectric layer;
   (b) a layer of copper formed over and covering the first layer of chrome; and
   (c) a second layer of chrome formed over and covering the layer of copper.

* * * * *